United States Patent [19]
Kobayashi et al.

[11] Patent Number: 4,846,709
[45] Date of Patent: Jul. 11, 1989

[54] REINFORCED CONNECTION FOR A CHEMICAL CONNECTOR AND METHOD OF CONSTRUCTING THEREFOR

[75] Inventors: Kenzo Kobayashi; Hideto Tachibana, both of Ichihara, Japan

[73] Assignees: The Furukawa Electric Co., Ltd; Sony Chemicals Corporation, both of Tokyo, Japan

[21] Appl. No.: 111,200

[22] Filed: Oct. 22, 1987

[51] Int. Cl.$^4$ ............................................... H01R 9/09
[52] U.S. Cl. ........................................ 439/161; 439/67
[58] Field of Search ........................ 439/67, 161, 493

[56] References Cited

U.S. PATENT DOCUMENTS

| 2,377,222 | 5/1945 | Fruth | 439/161 |
| 3,569,901 | 3/1971 | Conner | 439/161 |
| 4,111,510 | 9/1978 | Zurcher | 439/67 |
| 4,487,465 | 12/1984 | Cherian | 439/161 |
| 4,621,882 | 11/1986 | Krumme | 439/161 |

OTHER PUBLICATIONS

The Furukawa Electric Company, Ltd. Brochure, published 10-25-1986.

Primary Examiner—Neil Abrams
Attorney, Agent, or Firm—Oblon, Spivak, McClelland, Maier & Neustadt

[57] ABSTRACT

A reinforcing fastener for fastening a chemical connector and an electronic circuit includes a substantially cylindrical section shaped element having edges defining an axial slit, wherein the element is formed of an alloy having both superelastic and shape memory properties. The slit is of such a size at a temperature below the Martensite transformation temperature of the alloy that the alloy is superelastically deformed when the slit is maintained at the same size while the alloy is above the Martensite transformation temperature. This results in the chemical connector being fastened to the electronic circuit with a substantially constant force over time.

4 Claims, 4 Drawing Sheets

Fig. 2 (G) PRIOR ART

REINFORCED CONNECTION FOR A CHEMICAL CONNECTOR AND METHOD OF CONSTRUCTING THEREFOR

BACKGROUND OF THE INVENTION

The present invention relates to a reinforced connection part of chemical connectors such as an anisotropic electroconductive membrane, elastomer connector, etc. and a method of construction therefor. It concerns, in particular, improvements in reliability in high-temperature regions during long term use.

Recently, chemical connectors such as anisotropic electroconductive membranes, elastomer connectors, etc. have been used for the connection of high-density fine-pattern electrodes such as a Liquid Crystal Display (LCD), a Light Emitting Diode (LED), an Electroluminescence (EL), etc. to a flexible printed circuit (FPC). For example, when the transparent electrode (hereinafter abbreviated as Indium Tin Oxide (ITO) membrane electrode-ITO) being an electrode on the side of an LCD, and a FPC to drive it are joined, a method of heating under pressure allowing the anisotropic electroconductive membrane (membrane conducting to the direction of thickness but not conducting to the direction of width) to lie between both has been adopted for adhesion. But, since the base resin of this electroconductive membrane is of hot-melt type, the adhesive force tended to decrease at a raised temperature. Moreover, in the case of the so called zebra connector, a sheet-like connector made in such a way that silicone type rubber and electroconductive layer admixed fine powders such as carbon black etc. with said rubber are superposed alternately is pressed to be joined by external force. However, with simple pressing by said external force, there arise inconveniences such as the occurrence of poor junctions etc. because of the creep etc. of materials occuring at the time of long-term use. In order to improve on this, a method of joining both electroconductive portions is carried out, wherein a heat seal connector, the electroconductive portion consisting of electroconductive pastes such as carbon, Ag, etc. being formed in the base film of adhesive layer by a printing method, is allowed to lie between said ITO and FPC and brought into adhesion under heat.

Recently, with the advent of the coloration of LCDs and the requirement for more distinction of image quality, it has become necessary to make the clearance between conductors in the ITO portion provided on the screen of an LCD even smaller. Specifically, the pitch between electrodes to be provided for an ITO membrane electrode has dropped from 0.4 mm to a level of 0.3 or 0.2 mm, and the heat seal connector used in the printing method aforementioned has not been able to correspond to this any longer. In addition, since the use fields of LCDs have increased from so-called disposable consumption type products such as watches, camera and TVs to long-life, high-reliability and durability type products, for example, terminal input-output devices of work station and OA instruments and planar display products for cars, for which high functionality is required, the connector system used up to this time as described above has become unsatisfactory.

In such a situation, a method is known wherein not only said high-density fine-pattern electrode and FPC are pressed simply through a chemical connector, but also the connection part is fastened tightly with suitable metal fittings, for example spring materials for the reinforcement. By this method, however, sufficient tightening cannot be obtained, since the size of the connection part, for example the thickness, is extremely small, i.e., around 1.5 mm, the size of a spring is restricted so that the deformation quantity of the spring cannot be large, and the superelasticity of the spring is also a strain of less than 1% at most. Moreover, with a large spring, which occupies a large space, the miniaturization and the thinning of instruments are difficult, and with a small spring the attachment thereof to the connection part by deforming it within a limit of elastic deformation is difficult. Furthermore, the spring materials have such properties that the tightening force varies significantly depending on the extent of strain, and there is a shortcoming that the tightening is lowered drastically if creep deformation, etc. are caused in the constituent materials of the connection part, for example.

For this reason, in Japanese Unexamined Patent Publication No. Sho 61-203698, such a shape memory alloy is disclosed as a metal fitting to hold down and reinforce the connection part. By using this, many advantages can be obtained such that the reinforcement of the connection part of an electronic circuit becomes extremely easy, the discrepancy of position between that at the time of attachment and that at fixation does not occur compared with the method to press down physically, the force of pressing can be controlled by the thickness and the shape of the metal fitting and, at the same time, there are no partial floatings and gaps occuring when using spring materials, so that uniform contact force can be obtained, and the like. However, the reinforcing metal fitting described in the specification of the foregoing patent has a shape as shown in FIG. 2 (G) and, because of the long legs thereof, the contact with the connection part of electronic circuit becomes a surface contact, resulting in that the nonuniformity of the holding area is inevitable. Moreover, in the reinforcing metal fitting, superelasticity is necessary, but there is no concrete description about this fact in the specification thereof.

As a result of diligent investigations with respect to these points, the inventors have discovered that the shape and the superelasticity of reinforcing metal fitting (hereinafter referred to as a fastener) comprising the shape memory alloy affect significantly the reliably at high-temperatures in use over a long term, leading to the present invention.

SUMMARY OF THE INVENTION

The present invention provides a method, wherein the miniaturization and the thinning of an LCD, etc. are possible and the improvement in the reliability of connection between the ITO and the FPC also becomes possible. Namely, onto said connection of electronic circuit members comprising an ITO and FPC or ITO, a chemical connector and an FPC, is positioned a reinforcing fastener which comprises a superelastic shape memory alloy and which is machined into a circular shape, elliptic shape, flattened elliptic shape or preferably horseshoe shape in section with a slit in the axial direction. The connection part is held insertedly in the slit through the linear contact by means of the tightening force generating through the recovery in shape of said fastener, and a tightening force can become a uniform holding force through an additional superelastic effect.

BRIEF DESCRIPTION OF THE DRAWINGS

FIG. 2 (E) and (F) show the sectioned shapes of other fasteners which are shown for reference.

FIG. 2 (G) is the fastener is U shape is section with long legs, which has been used conventionally.

DETAILED DESCRIPTION OF THE PREFERRED EMBODIMENT

Figure 2:
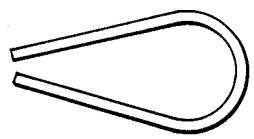
FIGS. 2 (A) through (D) respectively show the fasteners of the invention in horseshoe shape, circular shape, elliptic shape and flattened elliptic shape in section.
Figure 2:
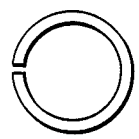
Figure 2:
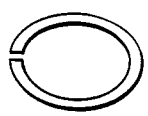
Figure 2:
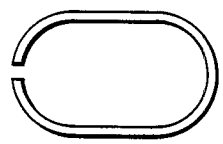
Figure 2:
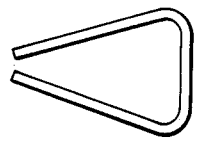
Figure 2:
Figure 2:
Figure 3:
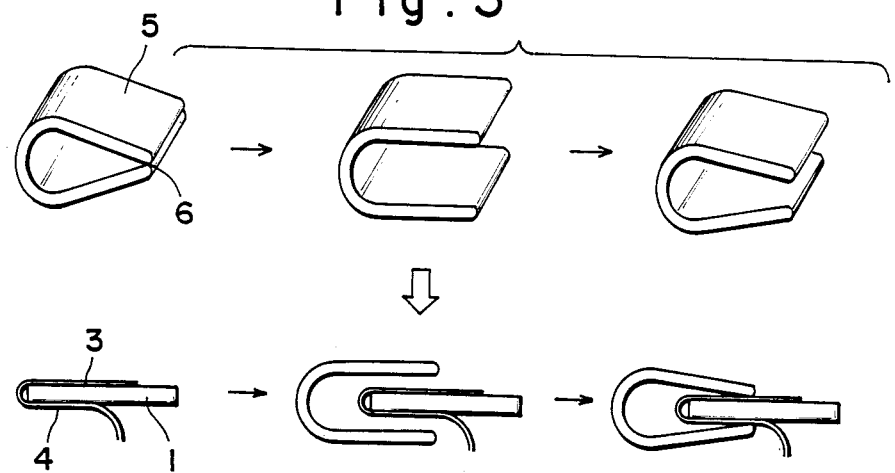
FIG. 3 is a diagram showing an outline of the process when attaching the horseshoe shape fastener in section of the invention.

In the invention, upon attaching the reinforcing fastener to the connection part, the shape memory effect of the alloy is utilized. Thus, a plate of shape memory alloy is rolled up to make a cylindrical fastener with a slit in the axial direction thereof. The cylindrical form may be of circular shape, elliptic shape, flattened elliptic shape or preferably horseshoe shape in section as shown in FIGS. 2 (A) through 2(D). This shape is memorized at a temperature over the Martensite transformation temperature (Af point) so that at a state where the elastic force of the fastener is lowered by cooling to an appropriate temperature under the AF point, the slit 6 may be opened by means of a slight force, and, by inserting the connection part thereinto as shown in FIG. 3, the fastener 5 can be covered onto the connection part with ZIF (zero insertion force). Finally, by heating or allowing heating of the fastener, a force to recover to the memorized shape is generated in the fastener 5 and, by means of the force, the connection becomes fastened tightly and strongly. The temperature for this fastener to recover to the memorized shape is that over the Af point, but it may be a temperature of pseudophase (temperature range lower than the Af point by 10° C. or so). This is because even the recovery of memorized shape at the temperature of the pseudophase under the Af point can give the desired tightening force, though weaker compared with that at the temperature over the Af point. With the fastener of the invention, the holding pressure becomes uniform over the whole length, since the connection part is held through linear contact.

Figure 1:
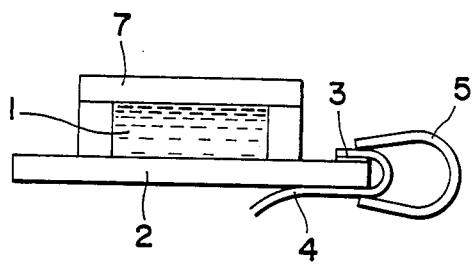
FIG. 1 shows one example of the reinforced connection part of the chemical connector according to the invention.

One example of the reinforced connection part with the connector of the invention when using the horeseshoe shape fastener in section is shown in FIG. 1. In the diagram, numeral 1 is the liquid crystal, numeral 2 is an ITO made on the glass substrate etc., numeral 3 is the chemical connector, numeral 4 is the FPC, numeral 5 is the reinforcing fastener, and numeral 7 is the screen.

Figure 6:
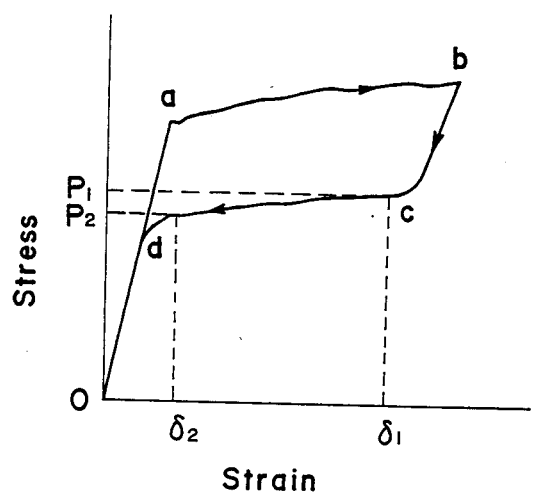
FIG. 6 is a graph showing the stress-strain characteristic of a superelastic alloy.

Further, it is also an important factor for the reinforcing fastener of the invention to have superelasticity as well as shape memory. The superelasticity is a property wherein (FIG. 6), even if deformed to point b, beyond point a which is the usual elastic limit, the strain returns to 0 via points c and d when the stress is removed and the change of stress versus strain is remarkably smaller in the region exhibiting the superelasticity, i.e. between c and d, than that in the usual elastic region. Accordingly, if the connection part is fastened tightly in this region c-d, variations of the tightening force can be kept extremely small despite creep deformation etc. of the materials of the connection part. The superelasticity of the material for the fastener of the invention shows an extremely high strain amounting 6 to 8%, whereas that of the spring materials made from phosphore bronze etc. is lower than 1%.

In the invention, simple attachment of parts and high reliability are satisfied by simultaneously utilizing both said shape memory effect and superelasticity effect.

As the shape memory alloys with superelasticity usable for the materials of the reinforcing fastener of the invention, Ni-Ti type alloy (alloy mainly composed of intermetallic compounds between Ni and Ti, or alloys substituting a part of either or both of Ni and Ti with other elements such as Fe, Co, Cu, Cr, etc.) and Cu-Zn type, Cu-Al type, Fe-Si-Mn type, Fe-Ni-Cr type, Fe-Ni-Co-Ti type and other type alloys can be mentioned. Thereamong, the use of Ni-Ti type alloy is particularly preferable. The Af point of alloy can be established advantageously between 0° and 20° C. in order to recover to the memorized shape in the vicinity of normal temperature.

As the shapes of the fastener, any of horseshoe shape, circular shape, elliptic shape and flattened elliptic shape in section shown in FIG. 2 (A) through (D) may be used, but the horseshoe shape in section in (A) is preferable. If the section is circular shape, the bulge when attached to the connection part is large, resulting in the connector not only becoming too thick compared to the depth required for the instruments but also in the danger of causing damage to the connection part by the edges of slit in the course of long term use. Moreover, when forming the plate of alloy, the elongation of the edge tends to occur and, as a result, warpage is caused to the fastener or the linearity of the slit is damaged to make the tightening force nonuniform in some cases, leading to somewhat poor applicability. The elliptic shape and flattened elliptic shape in section in (C) and (D) have similar shortcomings to a circular fastener in the above points, except that the bulge when attached to the connection part becomes small, so that there remain practical problems. With the fastener in horseshoe shape in section, there is no such fear, and it is preferable because of the capability of being made thin compared to the depth required for the instruments.

FIG. 2 (E) and (F) are sectional shapes of fasteners shown for reference. There, the fastener in triangular shape in (E), the curvature at the bending portions being steep, has a danger that cracks can occur at those portions and thus it is not reliable. With the fastener of an approximately semicircular shape in (F), the holding portion has surface contact similarly to a U shape fastener used conventionally and, in addition, the machining necessary for keeping the unevenness on the contact surface of the fastener component itself uniform is difficult due to the hard machinability of shape memory materials. As a result, when so fitted, uniform holding force is hard to obtain.

Figure 7:
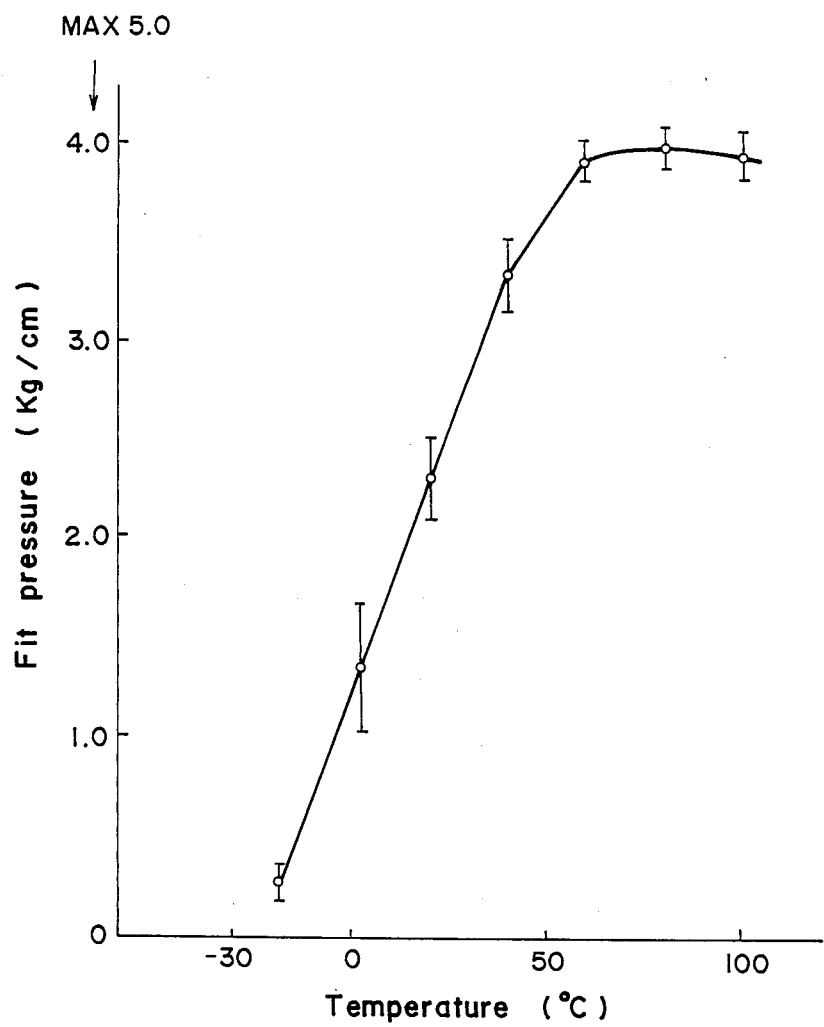
FIG. 7 shows the relationship between fit pressure of the fastener and a temperature characteristic.

The fastener of the invention has the slit in the axial direction. The opening amount of this slit is memorized so that a zero or sufficiently small clearance exists relative to the thickness of the connection part to be held. The size of the fastener is 1 to 500 mm in length and about 0.3 mm in thickness and, in the case of a horseshoe shape in section, an outer diameter of the bending portion is about 2.3 mm, a width from the back face of bending portion to the tip of flat portion is about 3.9 mm and, in the case of a circular shape, a diameter of 1.5 to 3 mm is practical, respectively. The tightening force generated with these shapes is more than zero but not more than 4 kg/cm, though it may be variable depending on the composition of materials and the temperature for heat treatment (refer to FIG. 7).

Figure 4:
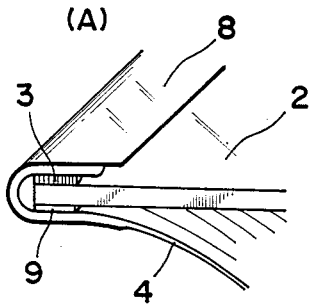
FIGS. 4 (A, B, C and D) is a detailed diagram of the process of FIG. 3.
Figure 4:
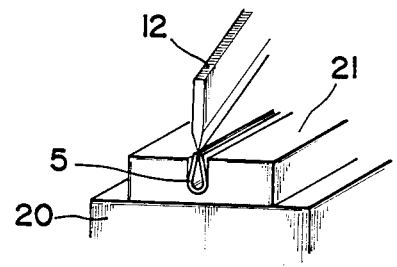
Figure 4:
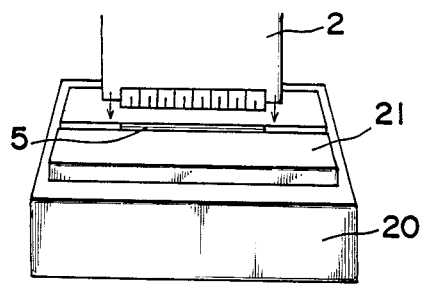
Figure 4:
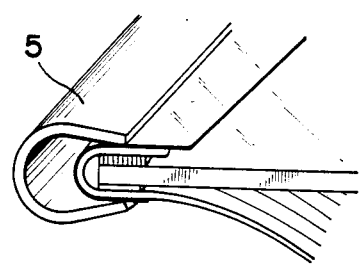

The fastener formed at over the Af point is then cooled to open the slit. Using a cooling device 20 as shown, for example, in FIG. 4 (B) and (C), cooling of the fastener 5 is made to about −50° to −20° C. by placing it insertedly in a concave groove on the plate. 21, and the slit 6 having elastic force is opened with an opening adapter 12. When the connection part of electronic circuit members is inserted into this opening, then taken out together with fastener 5 and allowed to stand at normal temperature or heated, the tightening pressure is generated due to the shape recovery of the fastener to hold the connection part for reinforcement. For the connection part, a thin sheet 8, of polyethylene terephtalete (PET), or rubbers having elasticity and double face adhesive tape 9 can be used more conveniently for the attachment of the fastener, as shown in FIG. 4 (A).

Figure 5:
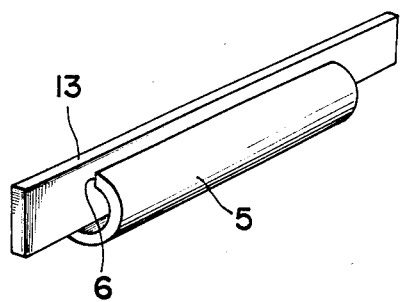
FIG. 5 is a diagram showing an another method to assure the opening quantity in the slit of a fastener.

For the opening of the slit of the fastener, the following other method can be used. After cooling the fastener to a temperature easy for deformation, a spacer 13 is allowed to slide axially while inserting it into the slit 6 as shown in FIG. 5. This is inserted into the concave groove of cooling device and thereafter the spacer 13 is removed by pulling out. Since the slit 6 is opened by the thickness of spacer 13 at this time, the connection part can be held insertedly in the slit by the same procedure as above. According to this method, the attachment of fastener 5 becomes extremely easy and no variation occurs in the contacting state of connection part, to permit excellent reinforcement.

Besides, although the slit portion 6 deforms more or less at the time of opening with opening adapter 12 or pulling-in of the spacer 13, the memorized shape is recovered due to the shape recovery with an increase in the temperature, if kept as it is.

In the invention, the chemical connectors are not always necessary. In some uses, the use of a chemical connector 3 is preferable because it is necessary to position glass substrate etc. 2 and FPC 4 in advance, but, in other uses, the positioning of glass substrate etc. 2 and FPC 4 can be made directly in the same form to omit the use of a chemical connector. In the system driving the liquid crystal 1, a conductor resistance of 100 to 300 Ω is permissible between substrate 2 and FPC 4, but, when only several ohms (as low as about 5 Ω) are permissible in the special case, the use of chemical connector 3 is impossible because of high resistance, and therefore contact is to be made directly (Example 3).

As evident from the description above, according to the invention, the reliability in a high-temperature region or at the time of use over long term, which is a shortcoming of the connection through a chemical connector, has been enhanced by means of the uniform tightening force due to superelasticity to raise the value of products and, at the same time, a design which is compact and suitable for the miniaturization and thinning, and extremely easy attachment due to shape memorization has been made possible. Therefore, the invention exerts remarkable effects industrially.

In the following, the invention will be illustrated in more detail using examples, but it is not confined to these.

EXAMPLE 1

Onto a heat-sealed connection part the ITO membrane electrode on the side of an LCD formed on the glass substrate with a thickness of 0.55 mm and FPC stuck copper foils with a thickness of 18 μm onto the polyimide film with a thickness of 25 μm at a pitch of 0.2 mm and plated with gold through an anisotropic electroconductive membrane with a thickness of 200 μm (made by Sony Chemical Co.), a reinforcing fastener in horseshoe shape in section shown in FIG. 2 (A) was covered to form the reinforced connection part of the invention shown in FIG. 1.

For the shape memory alloy with superelasticity, Ni-Ti type alloy, the Af point being about 1° C., was used. This was memorized in cylindrical form and in horseshoe shape in section, the size being 70 mm in length, 0.3 mm in thickness, 2.3 mm in outer diameter of bending portion and 3.9 mm in width from the back face of bending portion to the tip of flat portion, to make the fastener (opening quantity of slit : 0), and, after widened the opening quantity of slit to 1.7 mm at −50° C., it was attached to the connection part.

Using this, high-temperature continuous tests at 80° C. and 100° C. and MIL (STD 202-106) test were conducted to determine the contact resistances at an initial shape of test and after 1000 hours, which were compared with those of a conventional connection part (current applied on measurement : 0.1 mA). Results are shown in Table 1.

TABLE 1

|  | Conventional connection part* | | Connection part in Example 1 | |
| --- | --- | --- | --- | --- |
|  |  | After 1000 hrs. |  | After 100 hrs. |
| High-temperature continuous test 80° C. | Initial value 10–20Ω | >100Ω | Initial value 10–20Ω | <20Ω Little change |
| High-temperature continuous test 100° C. | Initial value 10–20Ω | Impossible to measure | Initial value 10–20Ω | 10–30Ω |
| MIL STD 202-106 | Initial value 10–20Ω | After 1 cycle >100Ω | Initial value 10–20Ω | After 10 cycles 10–50Ω |

Note: Average value of N 150 bars × 5 units
*Hardened with epoxy resin (Heat seal connector)

As evident from Table 1, with the connection part used conventionally, the contact resistance after 1000 hours became extremely large at a high temperature of 80° C. or 100° C. and high resistance resulted after 1 cycle also by MIL test. Whereas, with the connection part in accordance with the invention, the contact resistance hardly changed by the test for 1000 hours at 80° C. and went no further than extremely slightly increasing even by the test for 1000 hours at 100° C. Moreover, the resistance after 10 cycles was not higher than 50 Ω by MIL test, too.

EXAMPLE 2

Onto a heat-sealed connection part, the glass substrate with a thickness of 1.0 mm, the electrode being printed thereon, and FPC with a thickness of 100 μm through an anisotropic electroconductive membrane with a thickness of 200 μm (made by Sony Chemical Co.), the reinforcing fastener in circular shape in section shown in FIG. 2 (B) was covered to form the reinforced connection part of the invention.

For the shape memory alloy, Ni-Ti type alloy, the Af point being 10° C., was used. This was allowed to memorize to the shape in cylindrical form with a diameter of 1.5 mm and an opening quantity of the slit of 1.0 mm to make the fastener and, after widened the opening quantity of the slit to 1.3 mm at −50° C., it was attached to the connection part.

Using this, various tests shown in Table 2 were performed to determine the contact resistances before and after the test, which were compared with a conventional article sealed in the anisotropic electroconductive membrane with epoxy adhesive. As a result, with the conventional article, remarkable increases in the contact resistances were recognized under all conditions shown in Table 2, but, with the article of the invention, no serious variations were recognized in the contact resistance.

TABLE 2

| | |
|---|---|
| (1) Heat cycle test | 85° C.−−35° C., 120 cycles |
| (2) High-temperature continuous test | 100° C., 1000 hrs. |
| (3) High-temperature, high humidity continuous test | 60° C., 95% RH, 400 hrs. |
| (4) MIL (STD 202-106) | 10 cycles |

Contact pressure: 2.2 kg/cm at 20° C.

EXAMPLE 3

A case when the glass electrode and FPC are fitted directly with the fastener is exemplified.

In the glass substrate with a thickness of 1.1 mm, the electrode being printed thereon and, for the electrode, primer plating with nickel and top plating with gold being given on ITO membrane so as the total thickness to become 1 to 3 μm, and FPC with a total thickness of 43 μm (the thickness of Kapton base film is 25 μm, that of copper foil is 18 μm and nickel plating and gold plating are given on the foil in total of 1 to 5 μm), the width of electrode, the pitch and the number of electrodes being 0.5 mm, 1.0 mm and 100, respectively, both electrodes were positioned to coincide each other (at this time, if employing methods such that, with the aid of adhesive layer provided beforehand on a part of FPC side, this is heat-sealed onto the side of glass substrate for temporary fastening, and the like, the positioning of both electrodes can be made more easily). Then, the reinforcing fastener in horseshoe shape in section shown in FIG. 2 (A) was covered and both electrode portions were connected with this reinforcing fastener.

Following this, the contact resistance between these both electrodes was measured to determine the initial value, which was 3 to 5 μ. This same sample was allowed to stand for 1000 hours under an atmosphere at 80° C. for the high-temperature continuous test. Thereafter, the contact resistance between same electrodes was 4 to 7 μ, showing a slight increase, but this increase is not problematic at any rate upon use. On the other hand, as a conventional comparative example, the connection of said glass electrode to FPC was made in a way that zebra type connector of sheet-like elastomer described previously was placed on the junction and was pressed further by external force to connect. According to this conventional example, initial value was 3 to 5 μ, but after the treatment for 500 hours at 60° C., some of 100 electrodes had a resistance of higher than 30 Ω and, when extending the test time further, some other electrodes were seen to be worsened to scores of ohms. Based on this fact, it is understood that the example in accordance with the invention exerts sufficient effect.

EXAMPLE 4

A plate of Ni-Ti alloy (Ni 50%, Ti 50%) with a thickness of 0.3 mm and a width of 9.5 mm was machined into tube form with a diameter of 3 mm by roll forming and the shape memory treatment was given by fixing it to a jig so that the butt clearance became 0 to make a reinforcing fastener with a slit in the axial direction. Then, this fastener was cooled to a temperature easy to be deformed (−30° C.) and a spacer with a width of 7 mm, a thickness of 1.5 mm and a length of 220 mm was inserted into the slit portion of the fastener, allowing it to slide in the axial direction to obtain the fastener for the reinforcement of the connection part as shown in FIG. 5.

Then, cooling the fastener being to −30° C., the spacer was pulled out and the connection part was inserted here to be covered by the fastener. The attachment of the fastener was extremely easy, the variation in the contacting state of connection part was also not seen at all, and excellent reinforcement was achieved.

We claim:

1. A reinforcing fastener for fastening a chemical connector and an electronic circuit, comprising a substantially cylindrical section shaped element having edges defining an axial slit, wherein said element is formed of an alloy having both superelastic and shape memory characteristics at a temperature above the Martensite transformation temperature of the alloy, said alloy being brought to a temperature above the Martensite transformation temperature after said slit is opened at a temperature below the Martensite temperature of the alloy and a connection part of the electronic circuit members is attached to said slit portion, whereby the chemical connector can be fastened to the electronic circuit with a substantially constant force over time due to the superelastic and shape memory characteristics of the alloy.

2. The fastener of claim 1 wherein said substantially cylindrical section is horseshoe shaped.

3. The fastener of claim 1 wherein said substantially cylindrical section is one from the group consisting of circular shaped, elliptical shaped and flattened elliptical shaped.

4. The fastener of claim 1 or 2 or 3 wherein the size of said slit at a temperature below the Martensite transformation temperature is substantially equal to a thickness of said connector.

* * * * *